United States Patent [19]

Sandhu et al.

[11] Patent Number: 5,540,810
[45] Date of Patent: Jul. 30, 1996

[54] IC MECHANICAL PLANARIZATION PROCESS INCORPORATING TWO SLURRY COMPOSITIONS FOR FASTER MATERIAL REMOVAL TIMES

[75] Inventors: Gurtej Sandhu; Richard L. Elliott; Trung T. Doan; Jody D. Larsen, all of Boise, Id.

[73] Assignee: Micron Technology Inc., Boise, Id.

[21] Appl. No.: 493,205

[22] Filed: Jun. 20, 1995

Related U.S. Application Data

[63] Continuation of Ser. No. 109,848, Aug. 20, 1993, abandoned, which is a continuation of Ser. No. 989,243, Dec. 11, 1992, abandoned.

[51] Int. Cl.$^6$ ............................. H01L 21/00; B24B 1/00
[52] U.S. Cl. .................... 156/636.1; 156/655.1; 156/656.1; 216/89; 216/95
[58] Field of Search ............................. 156/636.1, 645.1, 156/655.1, 656.1; 216/88, 89, 95

[56] References Cited

U.S. PATENT DOCUMENTS

| | | | |
|---|---|---|---|
| 3,838,442 | 9/1974 | Humphreys | 257/752 |
| 3,841,031 | 10/1974 | Walsh | 51/283 |
| 4,193,226 | 3/1980 | Gill et al. | 51/131.5 |
| 4,448,634 | 5/1984 | Lampert | 156/636 |
| 4,549,374 | 10/1985 | Basi | 51/283 R |
| 4,801,559 | 1/1989 | Imaoka | 437/192 |
| 4,811,522 | 3/1989 | Gill | 51/131.1 |
| 4,829,024 | 5/1989 | Klein | 437/192 |
| 4,889,586 | 12/1989 | Noguchi | 156/636 |
| 4,892,612 | 1/1990 | Huff | 156/636 |
| 4,944,836 | 7/1990 | Beyer | 156/645 |
| 4,956,313 | 9/1990 | Cote | 437/203 |
| 4,968,381 | 11/1990 | Prigge | 156/636 |
| 4,992,135 | 2/1991 | Doan | 156/636 |
| 5,124,274 | 6/1992 | Ohki | 437/67 |
| 5,124,780 | 6/1992 | Sandhu | 437/192 |
| 5,169,491 | 12/1992 | Doan | 156/636 |

OTHER PUBLICATIONS

William J. Patrick, "Application of Chemical Mechanical Polishing to the Fabrication", J. Electrochem. Soc., vol. 138, No. 6, Jun. 1991, pp. 1778–1784.

*Primary Examiner*—Thi Dang

[57] ABSTRACT

The present invention relates to integrated circuits (ICs) fabrication. Particularly, there is a cmp process which incorporates small quantities of two chemicals. The first chemical is the standard slurry mixtures, like water, aluminum-oxide and hydrogen-peroxide mixed into a slurry. The second chemical is a strong base chemical, like KOH, or potassium hydroxide. Moreover, the cmp process utilizes a system of closely regulating the timing of the two chemical process. Specifically, during a first time period, both chemicals are applied; thus increasing speed of the chemical removal of tungsten material. During a second time period, the KOH is removed, thus slowing down the chemical action and importantly achieving a greater degree of planerization than is capable by the two chemical first time period.

19 Claims, 4 Drawing Sheets

IC MECHANICAL PLANARIZATION PROCESS INCORPORATING TWO SLURRY COMPOSITIONS FOR FASTER MATERIAL REMOVAL TIMES

CROSS-REFERENCE TO RELATED OR COPENDING APPLICATIONS

This application is a continuation of application Ser. No. 08/109,848 filed Aug. 20, 1993, now abandoned which is a continuation of application Ser. No. 07/989,243 filed Dec. 11, 1992, now abandoned.

U.S. Pat. app. Ser. No. 07/817,167, filed Jan. 6, 1992, now U.S. Pat. No. 5,270,587 is a application filed by the same assignee. U.S. patent app. Ser. No. 996,985, filed Dec. 23, 1992, now U.S. Pat. No. 5,300,155 entitled an IC chemical mechanical planarization process incorporating slurry temperature control, is a application filed by the same assignee.

FIELD OF THE INVENTION

The present invention relates to integrated circuits (ICs) fabrication. Particularly, there is a chemical mechanical planarization (cmp) process incorporating the controlled timed release of two chemical mixtures. Uniquely, the cmp process speeds dramatically increase when applying the two stage chemical process.

BACKGROUND OF THE INVENTION

Historically, chemical mechanical planarization, also known as "cmp," has been developed for many uses in the semiconductor industry; like removing a thin top layer of material from a semiconductor wafer.

A representative cmp machine, as illustrated in FIG. 1, comprises: a wafer carrier 10 holding a semiconductor wafer 12 which is pressed against a course polishing pad 16 mounted on a platen or holder 18 which rotates about its axis. Not shown in this figure, is the chemical slurry which is applied to the pad 16 for using chemical action to further aid in removing material from the surface of the semiconductor wafer 12.

In operation, a cmp machine works like a sanding machine and acid bath combined. To mechanically remove wafer material, wafer 12 is positionally fixed and held against abrasive polishing pad 16 while platen or holder 18 rotates. The chemical slurry is used to chemically remove the wafer material.

FIG. 2 illustrates a representative cross section of a wafer 12 comprising: a tungsten material 20 having a top surface layer 23, a few silicon-type material sections 22, and a wafer base 24.

FIG. 3 illustrates the desired resulting wafer design desired after removing the appropriate amount of top layer material 23; thus, leaving a smooth and planar top surface.

Problems

A major problem with current cmp processes is that FIG. 3 is a goal that is achievable only by a long process time; usually requiring seven or more minutes. As illustrated in FIG. 4, it is shown that material 20 has not achieved a level surface that is even with the silicon-type material sections 22. this situation occurs because the chemical removal process usually continues to remove the tungsten even after the mechanical material removal process has ceased. It has been difficult to control the chemical removal process. The option of discarding the chemical process is not possible, it being the fastest removal process. Therefore, complex timing schemes have been developed for removing the wafers before the chemical process removes too much tungsten.

It is noted that the above described problem, as well as other problems, are solved through the subject invention and will become more apparent, to one skilled in the art, from the detailed description of the subject invention.

SUMMARY OF THE INVENTION

One skilled in the art will appreciate the advantage of the subject cmp process. Specifically, there is a cmp process which incorporates small quantities of two chemicals. The first chemical is the standard slurry mixtures, like water, aluminum-oxide and hydrogen-peroxide mixed into a slurry. The second chemical is a strong base chemical, like KOH, or potassium hydroxide. Moreover, the cmp process utilizes a system of closely regulating the timing of the two chemical process. Specifically, during a first time period, both chemicals are applied; thus increasing speed of the chemical removal of tungsten material. During a second time period, the KOH is removed, thus slowing down the chemical action and increasing the mechanical removal of material; thus importantly achieving a greater degree of plainerization than is capable by the two chemical first time period.

Other features and objects of the present invention will become more clear from the following detailed description of the invention, taken in conjunction with the accompanying drawings and claims, or may be learned by the practice of the invention.

Figure 1:
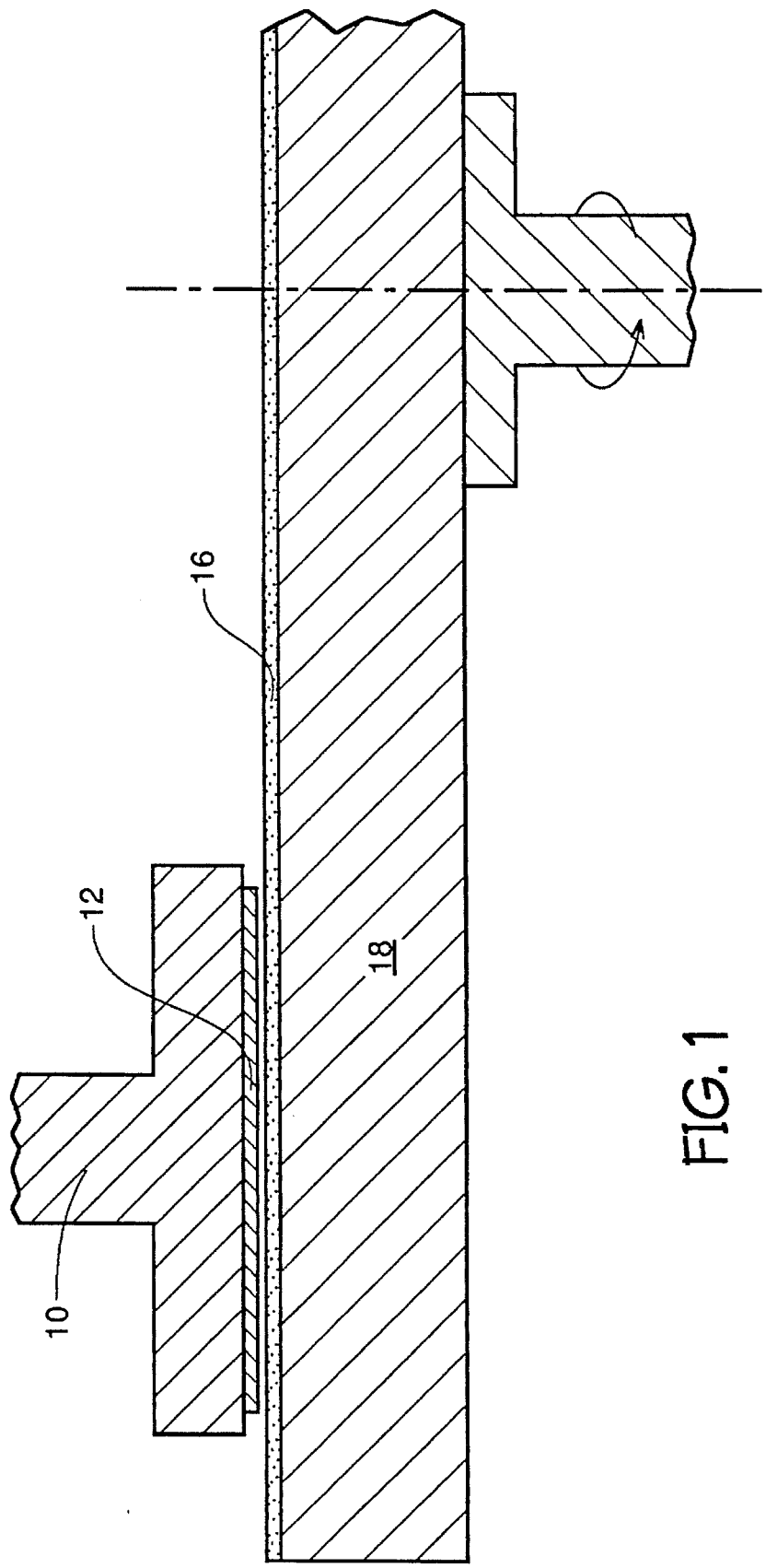
FIG. 1 is an illustration of a cmp machine.
Figure 2:
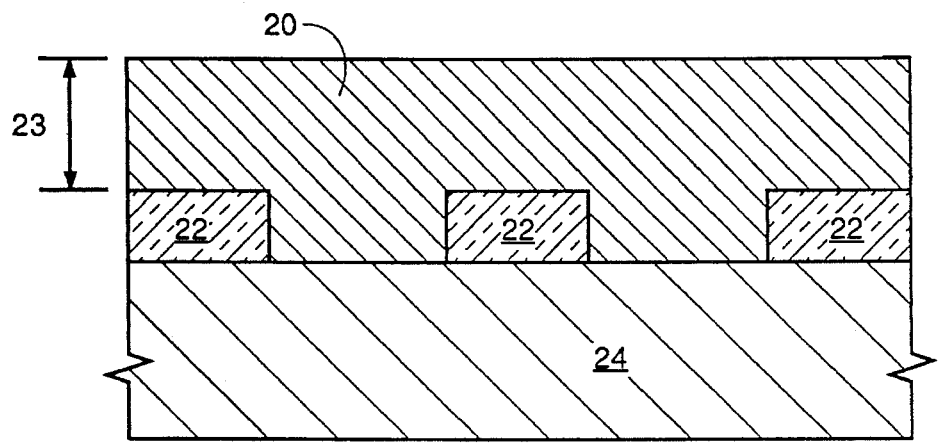
FIG. 2 is a cross sectional view of a wafer before undergoing a cmp process.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings. Additionally, like numbering in the drawings represent like elements within and between drawings.

DETAILED DESCRIPTION OF THE ILLUSTRATED EMBODIMENT

Incorporated Material

The following U.S. patents are herein incorporated by reference for pertinent and supporting information:

U.S. Pat. No. 4,992,135, is a method of etching back of tungsten layers on semiconductor wafers, and solution therefore.

U.S. Pat. No. 4,811,522, is a counterbalanced polishing apparatus.

U.S. Pat. No. 4,193,226, is a polishing apparatus.

U.S. Pat. No. 3,841,031, is a process for polishing thin elements.

General Embodiment

Figure 5:
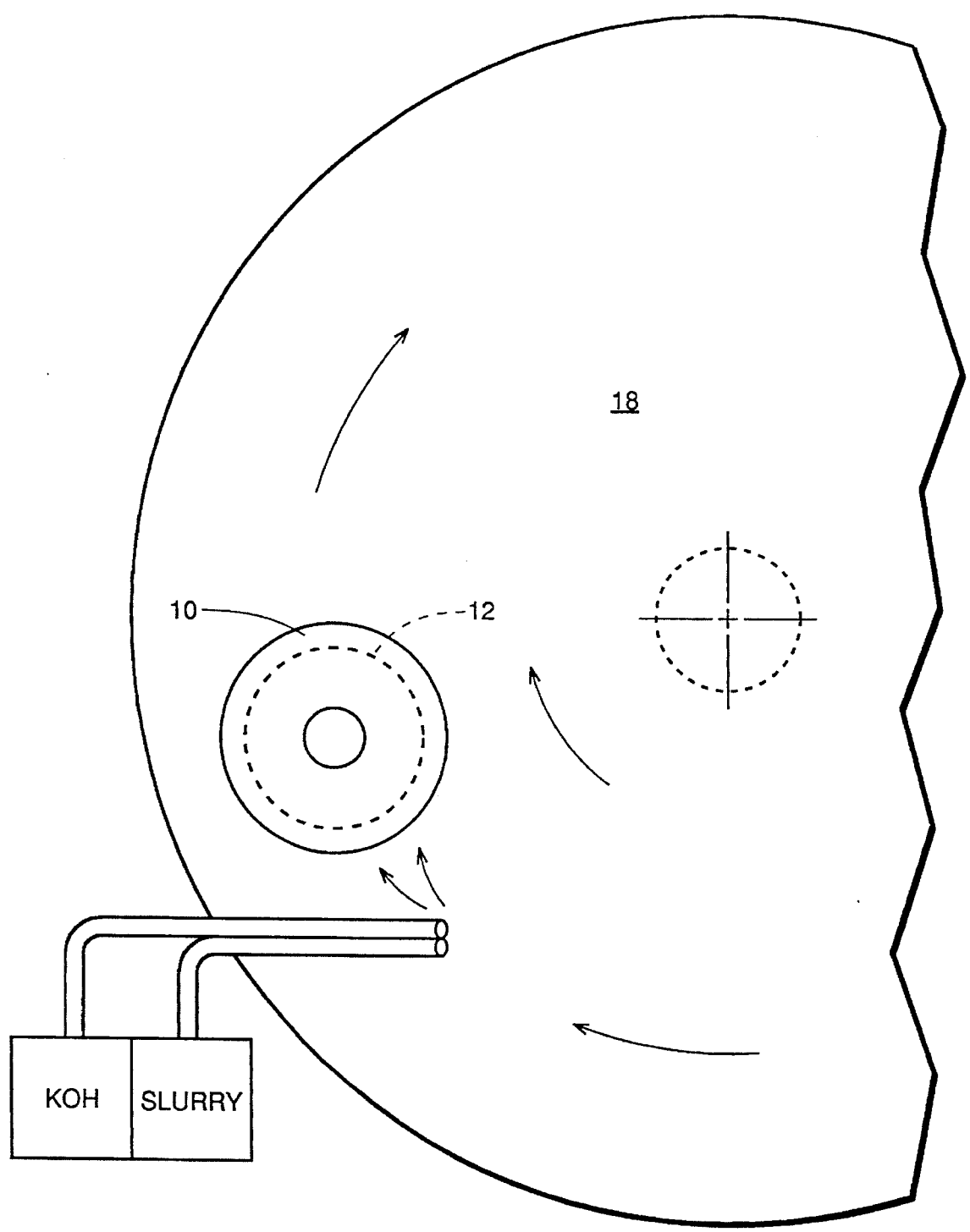
FIG. 5 illustrates a top view and representation of the cmp process.
Figure 6:
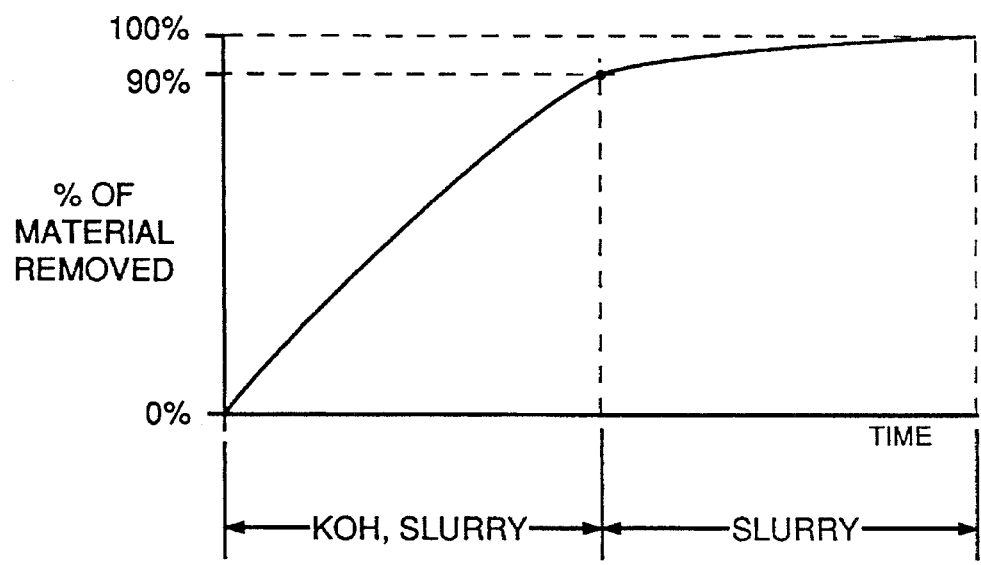
FIG. 6 illustrates the percentage of material removed over time given the first and second one minute time periods.
Figure 7:
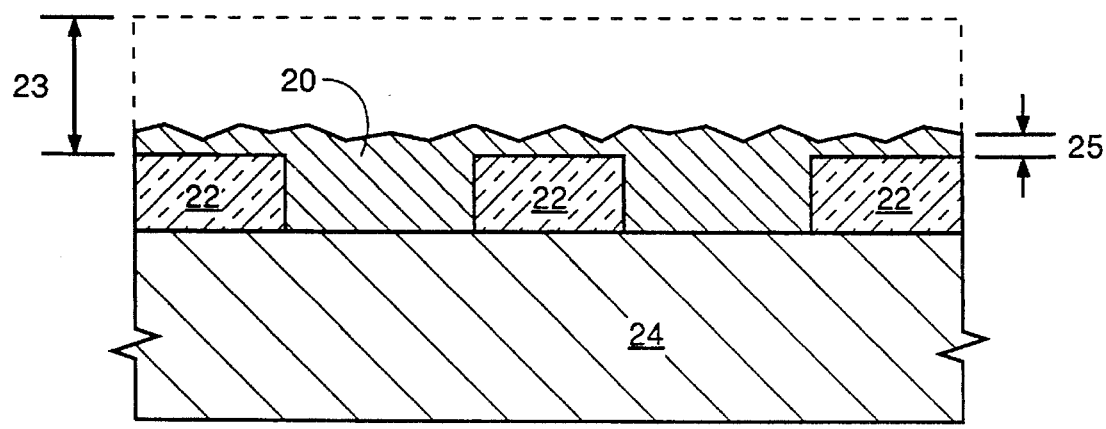
FIG. 7 illustrates a representative side view of a die on a wafer after undergoing the first time period of the proposed cmp process.

The following discussions are in reference to both FIGS. 5, 6 and 7. FIG. 5 illustrates a top view and representation of the cmp process. Specifically, it is demonstrated that KOH and slurry mixtures are applied to the cmp process via separate application delivery mechanisms, like tanks, pumps, and tubes. The two delivery design is unique to the invention. If KOH were to be mixed with the slurry, in a relatively short time, the slurry will begin to precipitate, or harden instead of remaining in a slurry mixture; thereby clogging the delivery mechanism. Thus it would be impossible to apply the combined mixture for any length of time. However, by separating the two chemicals, the separate application quantities and timing of those quantities can now be controlled.

FIG. 6 illustrates the percentage of material removed over time given the two chemical application time periods. One skilled in the art will recognize that approximately 90% of the top tungsten layer is removed during the first cmp process period. Uniquely, both chemicals are applied to the process, where KOH will perform the majority of the material removal. FIG. 7, illustrates that the planarization of the removed material is relatively rough, yet there remains a small portion 25 remaining to be removed.

Figure 3:
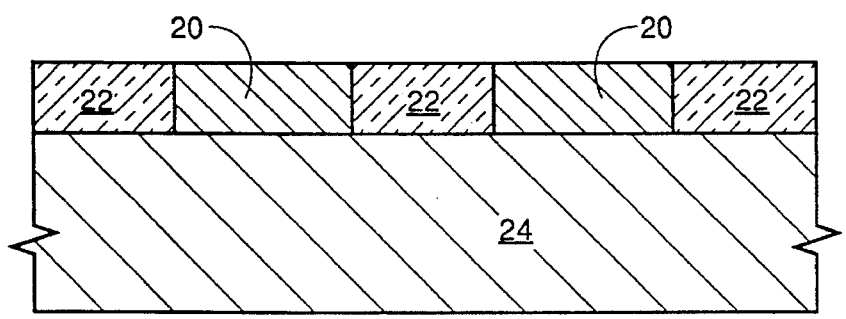
FIG. 3 is a desired cross sectional view of a wafer after successful removal of the top tungsten layer.
Figure 4:
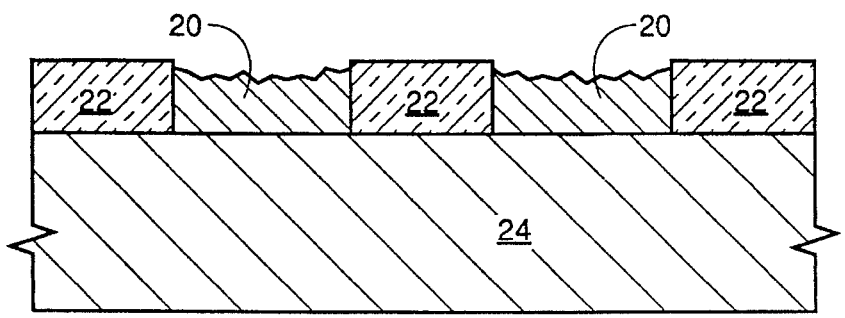
FIG. 4 is a cross sectional view of a wafer after undergoing a typical cmp process.

Again, referring to FIG. 6. One skilled in the art will understand that the removal of the KOH from the second time period will significantly slow the chemical removal process. In contrast, it is understood that during the second time period, a major portion of the remainder of the material selected for removal is eliminated by mechanical action. Mechanical material removal processes are much slower than chemical; however, mechanical processes are more precise in controlling the quantity of material to be removed. Uniquely, by combining the slurry and mechanical material removal process, a smooth planerization as was illustrated in FIG. 3 is achievable at a significantly faster rate than prior methods.

Remarks about the Invention

It is noted, by using the basic KOH chemical for a short period of the cmp process, roughly 80 to 90% of the material can be removed in the first time period. Whereas, prior art methods would have taken roughly 6 times the amount of time to accomplish the same task. Moreover, by eliminating the KOH application for the second time period, there is only a 10 to 20% of the material remaining to be removed by the conventional cmp process to achieve the desired planarization quality. Thus, only 10 to 20% of the time is the new method working as slow as prior art methods.

It is additionally noted that during the first time period the majority of the material is removed by the chemical action from the two chemical mixtures. However, it should not be forgotten that a minority of the material, removed in this first time period, is removed by the mechanical action from the abrasive polishing pad 16.

Similarly, it is noted that during the second time period the majority of the material is removed by the mechanical action from the abrasive polishing pad 16. The minority of the material, removed in this second time period, is removed by the chemical action of the slurry chemical mixture. Mechanical material removal is slower, yet it is more precise for achieving a greater planerized surface than is achievable with the chemical action. This is one of the main reasons that a diluted slurry is used during the second period.

Variations in the Invention

There are several obvious variations to the broad invention and thus come within the scope of the present invention. Uniquely, this invention may work with any material (metals or dielectrics) to be removed via cmp processes; for example, Al, Cu, silicon dioxide, silicon nitride, etc.. Additionally, any typical slurry chemical used in a cmp process will yield satisfactory results, for example known acids, oxidizer agents, reducing agents, and basic chemicals will work.

Another variation to the invention, and in reference to FIG. 6, is that the time taken for the first time period (having KOH) may be varied for several reasons. If the concentration of KOH is increased, then the overall time to remove a given amount of material will decrease. Similarly, if it is possible to remove more than 90% of the material with KOH then the overall time of the first period would increase. However, if is not possible to accurately or finely control the quantity of the material to be removed then it may be advantageous to stop the removal process at about 80% before initiating the second time period of the cmp process. It is also noted that any combination of KOH concentrations and control of the removed material quantity will equally effect the timing between the first and second time periods. Therefore, the two time periods do not have to be equal. However, it is restated that not matter what the time periods are, the overall time for this new process will be much less than prior art processes not utilizing the KOH or equivalent chemicals.

Another variation is to have the two chemicals in the two tanks mixed before being applied to the surfaces of wafers. This could be done by joining the delivery tubes or by having an intermediate tank where the chemicals are then mixed.

Similarly, it is noted that, although the invention describes the use of two timing periods with the use or non use of KOH distinguishing the two periods, it is obvious to vary the timing periods to be multiple periods. With multiple periods, varying amounts of KOH, or its equivalents, can be applied over the various periods. This could allow the use of several concentrations of KOH to regulate the varying rates of material removal and planarization achievable.

While the invention has been taught with specific reference to one embodiment, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Although subheadings in the Detailed Description of the Illustrated Embodiment are used, these are merely provided for assisting the reader; wherein, the writer is free to enter any information under any heading/s.

What is claimed and desired to be secured by United States Patent is:

1. A planarizing method useful in the fabrication of semiconductors, comprising the following steps of:

planarizing a layered substrate in a chemical slurry; and altering the pH of said chemical slurry during said planarizing, thereby controlling the rate of said planarizing, wherein said planarizing comprises chemical mechanical planarizing.

2. The planarization method of claim 1, wherein the pH of said chemical slurry is altered by the addition of a chemical having a basic pH.

3. The planarization method of claim 2, wherein said basic chemical comprises potassium hydroxide (KOH).

4. The planarization method of claim 3, wherein said chemical slurry is added via a first delivery system, and said KOH is dispensed via a second delivery system.

5. The planarization method of claim 4, further comprising the step of:

halting said dispensing of said KOH, thereby decreasing the rate of said planarizing.

6. A pH controlled planarization process, comprising the steps of:

disposing a first layer over a topography on a substrate;

planarizing said layered substrate in a chemical slurry, thereby planarizing a substantial portion of said first layer covering said topography;

altering the pH of said chemical slurry during said planarizing; and planarizing the remaining portion of said first layer covering said topography.

7. The process of claim 6, wherein said chemical slurry comprises an aqueous solution having an oxidizer and a base, said base being potassium hydroxide, said potassium hydroxide being dispensed into said chemical slurry through a separate dispenser.

8. The process of claim 7, wherein said altering of the pH comprises halting said dispensing of said potassium hydroxide through said separate dispenser into said chemical slurry, thereby causing said chemical slurry to become more acidic.

9. The process of claim 8, wherein said first layer comprises a conductive material.

10. The process of claim 9, wherein said planarizing proceeding at a faster rate when said chemical slurry is more basic, said planarizing proceeding at a slower rate when said chemical slurry is more acidic.

11. The process of claim 10, wherein said planarizing comprises chemical mechanical means.

12. The process of claim 11, wherein said chemical mechanical means comprises said chemical slurry and a planarizing apparatus.

13. The process of claim 12, wherein said pH is altered over a specified time.

14. A method of enhancing planarization by altering the pH of the chemical slurry, comprising the following steps of:

layering a substrate with at least a first layer and a second layer, said first layer being disposed superjacent said second layer;

dispensing a chemical slurry onto said layered substrate, said chemical slurry being dispensed via a first system and a second system;

planarizing said layered substrate in said chemical slurry, said chemical slurry having a pH; and altering said pH of said slurry during said planarizing after a substantial portion of said first layer is removed.

15. The method of claim 14, wherein said chemical slurry comprises KOH.

16. The method of claim 15, wherein said pH is altered by adjusting the concentration of KOH in said chemical slurry.

17. The method of claim 15, wherein said pH is altered by decreasing the concentration of KOH over time.

18. The method of claim 17, wherein said KOH is dispensed via said second system, thereby enabling control of the concentration of KOH in said chemical slurry.

19. The method of claim 18, wherein said chemical slurry is an aqueous solution.

* * * * *